United States Patent
Fan et al.

(10) Patent No.: US 9,985,027 B2
(45) Date of Patent: May 29, 2018

(54) STABLE MULTIPLE THRESHOLD VOLTAGE DEVICES ON REPLACEMENT METAL GATE CMOS DEVICES

(71) Applicant: INTERNATIONAL BUSINESS MACHINES CORPORATION, Armonk, NY (US)

(72) Inventors: Su Chen Fan, Cohoes, NY (US); Sivananda K. Kanakasabapathy, Niskayuna, NY (US); Injo Ok, Londonville, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 17 days.

(21) Appl. No.: 15/361,794

(22) Filed: Nov. 28, 2016

(65) Prior Publication Data

US 2017/0077098 A1    Mar. 16, 2017

Related U.S. Application Data

(63) Continuation of application No. 14/748,424, filed on Jun. 24, 2015, now Pat. No. 9,536,791, which is a
(Continued)

(51) Int. Cl.
*H01L 27/092* (2006.01)
*H01L 21/8234* (2006.01)
(Continued)

(52) U.S. Cl.
CPC .... *H01L 27/0922* (2013.01); *H01L 21/28114* (2013.01); *H01L 21/82385* (2013.01);
(Continued)

(58) Field of Classification Search
CPC ....... H01L 21/823462; H01L 21/28114; H01L 21/283; H01L 21/823412;
(Continued)

(56) References Cited

U.S. PATENT DOCUMENTS 9,536,791 B2    1/2017    Fan et al.
9,728,462 B2    8/2017    Fan et al.
(Continued)

OTHER PUBLICATIONS

List of IBM Patents or Patent Applications Treated as Related; (Appendix P), Filed Dec. 11, 2017; pp. 1-2.

*Primary Examiner* — Peter Bradford
(74) *Attorney, Agent, or Firm* — Cantor Colburn LLP; Vazken Alexanian

(57) ABSTRACT

A technique for a multiple voltage threshold transistor structure is provided. A narrow channel and long channel are formed on a fin. An epitaxial layer is formed on the fin, and an interlayer dielectric layer is formed on the epitaxial layer. Spacers on the fin define the narrow channel and the long channel. A high-k dielectric material is deposited in the narrow and long channels. A metal layer is deposited on the high-k dielectric material in the narrow and long channels. A height of the high-k dielectric material in the narrow channel is recessed. The metal layer is removed from the narrow and long channels. A work function metal is deposited in the narrow and long channels. A gate conduction metal is deposited to fill the narrow channel and long channel. A capping layer is deposited on the top surface of the structure.

20 Claims, 14 Drawing Sheets

Related U.S. Application Data continuation of application No. 14/672,350, filed on Mar. 30, 2015, now Pat. No. 9,728,462.

(51) Int. Cl.
| | |
|---|---|
| *H01L 29/66* | (2006.01) |
| *H01L 21/8238* | (2006.01) |
| *H01L 21/28* | (2006.01) |
| *H01L 29/51* | (2006.01) |
| *H01L 29/08* | (2006.01) |
| *H01L 29/10* | (2006.01) |
| *H01L 29/49* | (2006.01) |

(52) U.S. Cl.
CPC ........ *H01L 21/823412* (2013.01); *H01L 21/823431* (2013.01); *H01L 21/823456* (2013.01); *H01L 21/823462* (2013.01); *H01L 21/823807* (2013.01); *H01L 21/823814* (2013.01); *H01L 21/823821* (2013.01); *H01L 21/823842* (2013.01); *H01L 21/823857* (2013.01); *H01L 27/0924* (2013.01); *H01L 29/0847* (2013.01); *H01L 29/1037* (2013.01); *H01L 29/4966* (2013.01); *H01L 29/517* (2013.01); *H01L 29/66545* (2013.01); *H01L 29/66553* (2013.01)

(58) Field of Classification Search
CPC ..... H01L 21/823431; H01L 21/823456; H01L 21/823807; H01L 21/823821; H01L 21/82385; H01L 21/823857; H01L 29/66545; H01L 29/66553; H01L 29/517
See application file for complete search history.

(56) References Cited

U.S. PATENT DOCUMENTS

| | | | |
|---|---|---|---|
| 2004/0067619 A1* | 4/2004 | Niimi | H01L 21/823462 438/275 |
| 2013/0244414 A1* | 9/2013 | Song | H01L 29/401 438/591 |

* cited by examiner

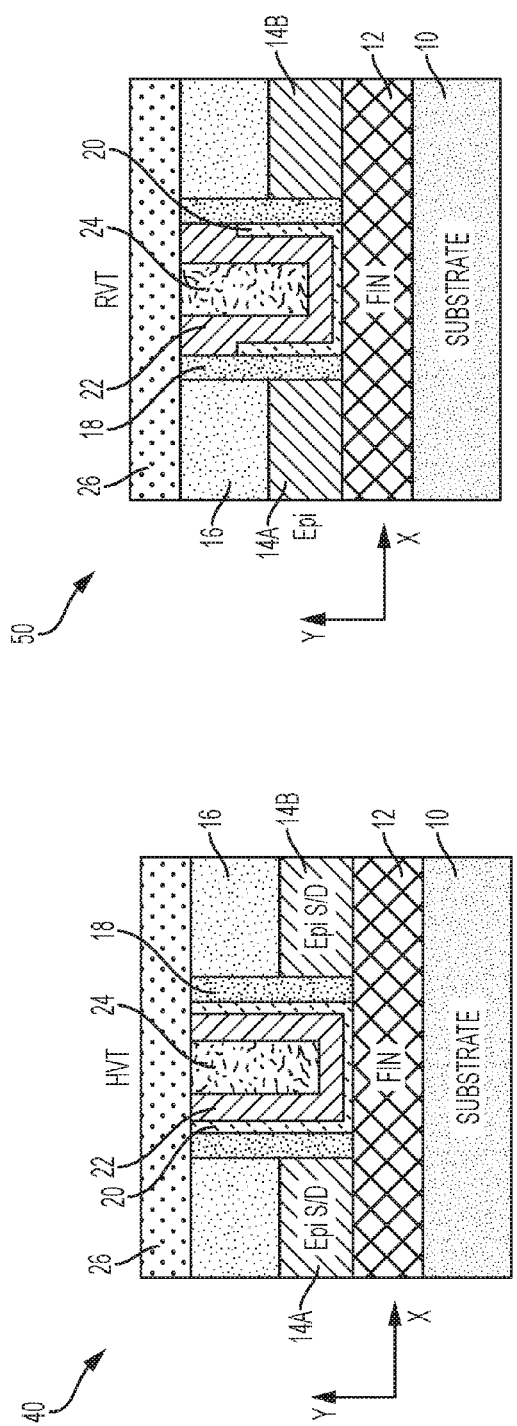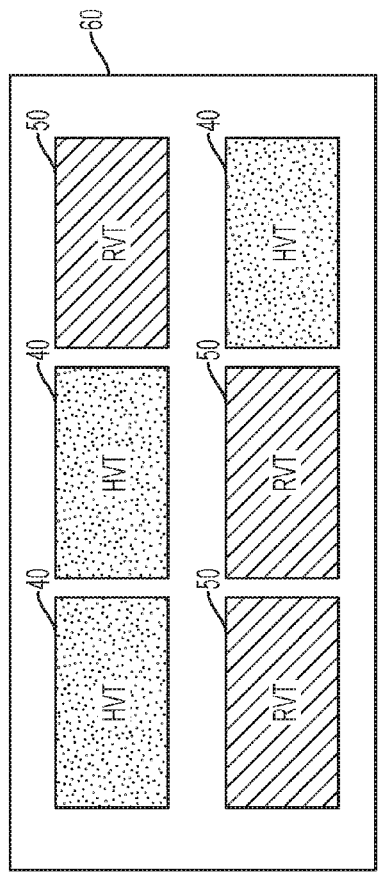
FIG. 1A
FIG. 1B
FIG. 1C

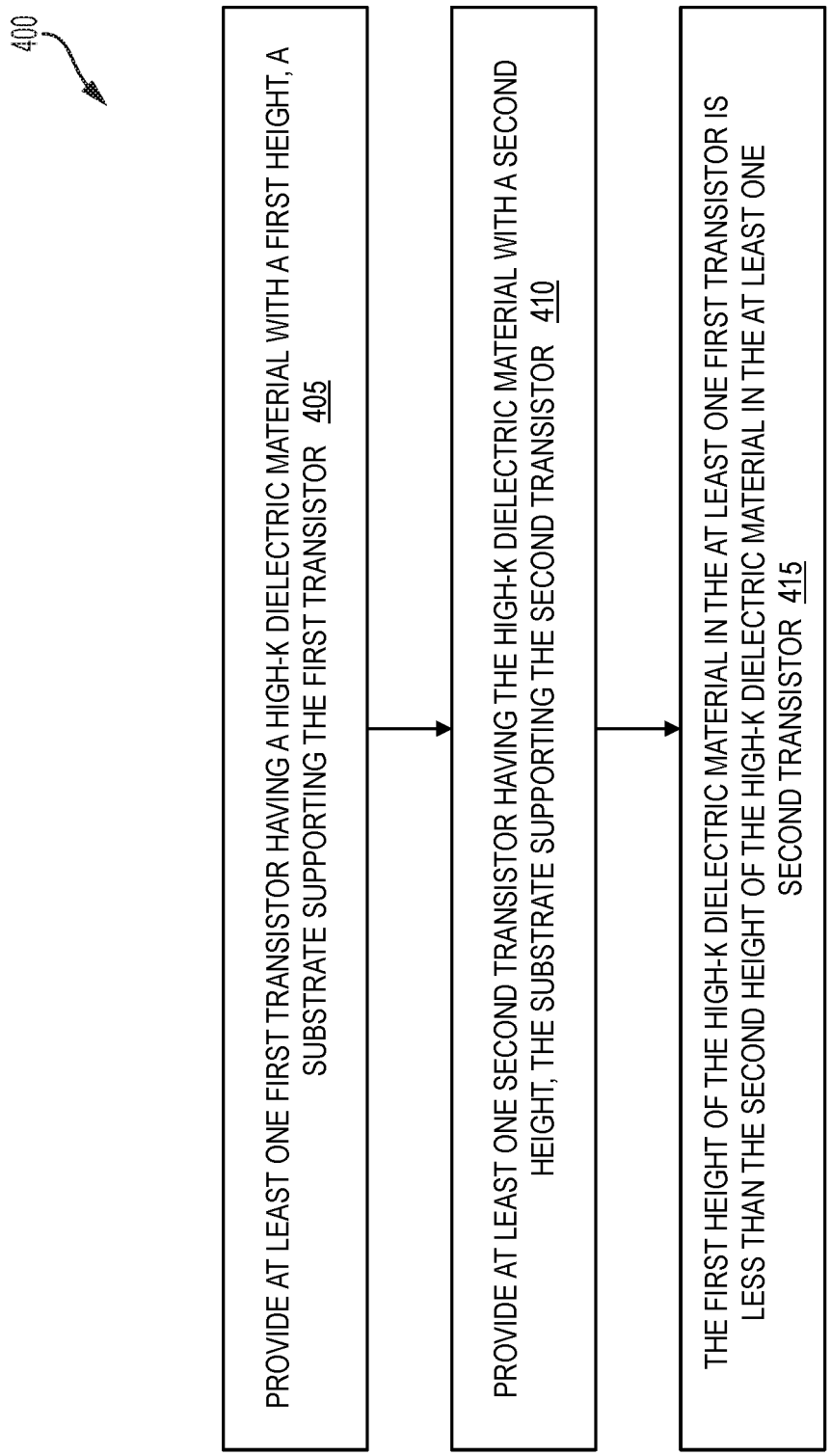

STABLE MULTIPLE THRESHOLD VOLTAGE DEVICES ON REPLACEMENT METAL GATE CMOS DEVICES

This application is a continuation of U.S. patent application Ser. No. 14/748,424, filed Jun. 24, 2015, which is a continuation of U.S. patent application Ser. No. 14/672,350, filed Mar. 30, 2015, the contents of which are incorporated by reference herein in their entirety.

BACKGROUND

The present disclosure relates generally to complementary metal oxide semiconductor (CMOS) technology/devices, and more specifically to forming stable multiple threshold voltage (Vt or Vth) devices on replacement metal gate (RMG) CMOS devices.

Multi-threshold CMOS (MTCMOS) is a variation of CMOS chip technology which has transistors with multiple threshold voltages (Vth or Vt) in order to optimize delay or power. The Vt or Vth of a metal oxide semiconductor field effect transistor (MOSFET) is the gate voltage where an inversion layer forms at the interface between the insulating layer (oxide) and the substrate (body) of the transistor. Low Vth devices switch faster, and are therefore useful on critical delay paths to minimize clock periods. The penalty is that low Vth devices have substantially higher static leakage power. High Vth devices are used on non-critical paths to reduce static leakage power without incurring a delay penalty. Typical high Vth devices reduce static leakage by 10 times compared with low Vth devices.

One method of creating devices with multiple threshold voltages is to apply different bias voltages (Vb) to the base or bulk terminal of the transistors. Other methods involve adjusting the gate oxide thickness, gate oxide dielectric constant (material type), or dopant concentration in the channel region beneath the gate oxide.

A typical method of fabricating multi-threshold CMOS involves simply adding additional photolithography and ion implantation steps. For a given fabrication process, the Vth is adjusted by altering the concentration of dopant atoms in the channel region beneath the gate oxide. Typically, the concentration is adjusted by ion implantation method. For example, photolithography methods are applied to cover all devices except the p-type MOSFETs with photoresist. Ion implantation is then completed, with ions of the chosen dopant type penetrating the gate oxide in areas where no photoresist is present. The photoresist is then stripped. Photolithography methods are again applied to cover all devices except the n-type MOSFETs. Another implantation is then completed using a different dopant type, with ions penetrating the gate oxide. The photoresist is stripped. At some point during the subsequent fabrication process, implanted ions are activated by annealing at an elevated temperature.

BRIEF SUMMARY

Embodiments include a method of forming a multiple threshold voltage transistor structure. The method includes forming at least one narrow channel and at least one long channel on a fin. The fin is deposited on a substrate, and spacers on the fin define at least one narrow channel and at least one long channel, and an epitaxial layer is formed on the fin. An interlayer dielectric layer is formed on the epitaxial layer. The method includes depositing a high-k dielectric material in the at least one narrow channel and the at least one long channel, depositing a metal layer on the high-k dielectric material in the at least one narrow channel and the at least one long channel, and recessing a height of the high-k dielectric material in the at least one narrow channel, after performing a protective process to protect the at least one long channel. Also, the method includes removing the metal layer from the at least one narrow channel and the at least one long channel, depositing a work function metal in the at least one narrow channel and the at least one long channel, and depositing a gate conduction metal to fill the at least one narrow channel and the at least one long channel. A capping layer is deposited on a top surface of the spacers, the interlayer dielectric layer, the work function metal, and the gate conduction metal.

Embodiments include a multiple threshold voltage transistor structure. The structure includes at least one first transistor having a high-k dielectric material with a first height, and a substrate supports the at least one first transistor. The structure includes at least one second transistor having the high-k dielectric material with a second height, and the substrate supports the at least one second transistor. The first height of the high-k dielectric material in the at least one first transistor is less than the second height of the high-k dielectric material in the at least one second transistor.

Embodiments include a method of configuring a multiple threshold voltage transistor structure. The method includes providing at least one first transistor having a high-k dielectric material with a first height. A substrate supports the at least one first transistor. The method includes providing at least one second transistor having the high-k dielectric material with a second height. The substrate supports the second transistor, and the first height of the high-k dielectric material in the at least one first transistor is less than the second height of the high-k dielectric material in the at least one second transistor.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present disclosure is particularly pointed out and distinctly claimed in the claims at the conclusion of the specification. The foregoing and other features and advantages are apparent from the following detailed description taken in conjunction with the accompanying drawings in which:

FIG. 1A illustrates a cross-sectional view of a high threshold voltage transistor device according to an embodiment;

FIG. 1B illustrates a cross-sectional view of a low/regular threshold voltage transistor device according to an embodiment;

FIG. 1C illustrates a top down layout of a multiple threshold voltage CMOS chip having both high threshold voltage transistor devices and low/regular threshold voltage transistor devices according to an embodiment;

FIGS. 2A through 2I illustrate cross-sectional views of a process flow for building both high threshold voltage transistor devices and low/regular threshold voltage transistor devices in the multiple threshold voltage CMOS chip according to an embodiment, in which:

FIG. 2A illustrates formation of narrow and long channel trenches with a high-k dielectric layer and a metal layer, FIG. 2B illustrates that chamfer-protection (CP) material is deposited to protect the narrow trench and the long trench, FIG. 2C illustrates that etching is performed to recess the chamfer-protection material in the narrow trench while the long trench is protected by an optical lithography mask, FIG. 2D illustrates etching (RIE) is performed to recess the high-k dielectric layer.

FIG. 2E illustrates removing the chamfer-protection layer,

FIG. 2F illustrates optional processing of stripping off the work function metal layer, FIG. 2G illustrates deposition of the work function metal layer, FIG. 2H illustrates that gate conduction metal is deposited to fill the trenches, and FIG. 2I illustrates gate cap dielectric deposition.

FIG. 4 illustrates a method of configuring a multiple threshold voltage transistor structure according to an embodiment.

Figure 2A:
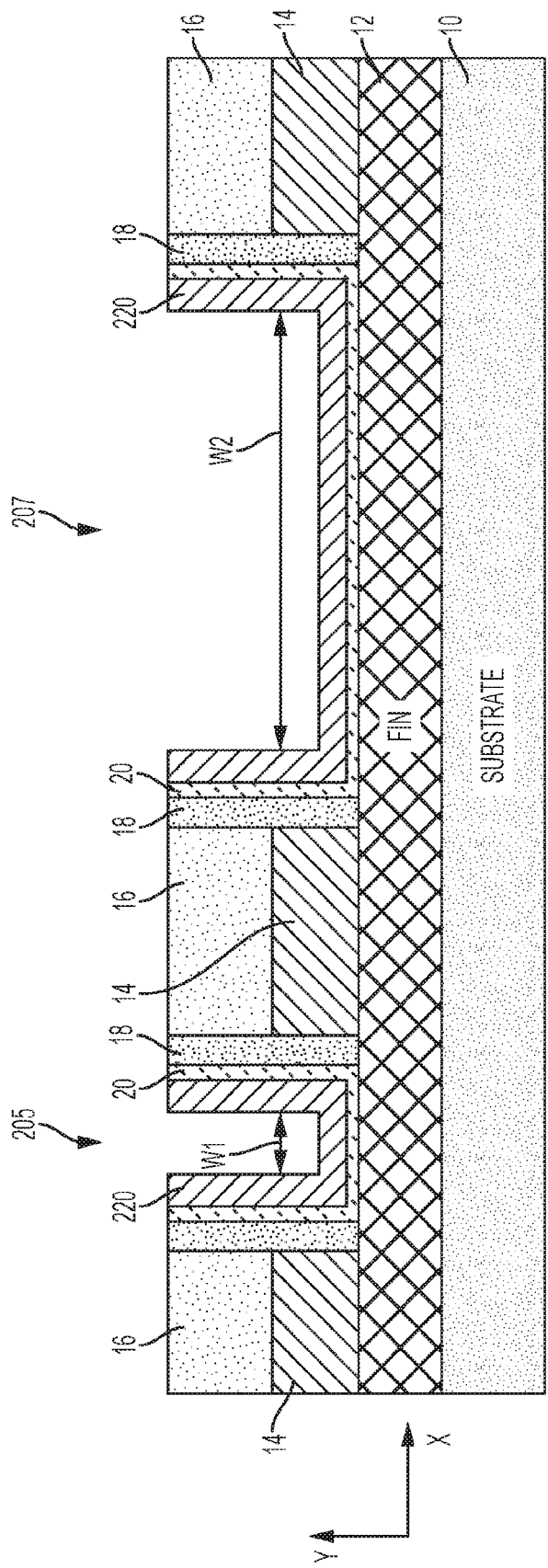

In the accompanying figures and following detailed description of the disclosed embodiments, the various elements illustrated in the figures are provided with three or four digit reference numbers. The leftmost digit(s) of each reference number corresponds to the figure in which its element is first illustrated.

DETAILED DESCRIPTION

Threshold voltage (Vt) adjustment in fully depleted (FD) FinFET (fin field effect transistor) devices may seem to be challenging. Channel doping can adjust Vt in a FD device and cause degraded random dopant fluctuations (RDF), mobility, etc.

Embodiments provide threshold voltage (Vt) modulation in NFETs (n-type field effect transistors) (and/or PFET). Threshold voltage (Vt) modulation refers to having transistors with different threshold voltages (such as a high threshold voltage, and regular/low threshold voltage) on the same chip. To achieve the different threshold voltages, the NFET has a recessed high-k dielectric. By having NFETs with the high-k dielectric recess and NFETs without the high-k dielectric recess, there can be an 80 millivolt (mV) difference in threshold voltages between the two NFETs in one case. The threshold voltage in the NFET with the high-k dielectric recess can be 80 mV lower than the NFET without the high-k dielectric recess. In one implementation, the threshold voltage in the NFET may be configured to have a Vt modulation range of 40-120 mV.

FIG. 1A illustrates a cross-sectional view of a high threshold voltage (HVt) transistor device 40 according to an embodiment. FIG. 1B illustrates a cross-sectional view of a regular/low threshold voltage (RVt) transistor device 50. The HVt transistor device 40 has a threshold voltage (Vt) higher than the RVt transistor device 50. FIG. 1C illustrates a top down layout of a multiple threshold voltage CMOS chip 60 having HVt transistor devices 40 and RVt transistor devices 50 according to an embodiment. The CMOS chip 60 has can have various arrangements of HVt and RVt transistor devices 40 and 50. Typically, ion implantation is used to make HVt transistor devices 40.

The HVt transistor device 40 and RVt transistor device 50 are formed on a substrate 10. The substrate 10 may be silicon, germanium, semiconductor-on-insulator (SOI) structure, etc. Fin material 12 is on top of the substrate 10. The fin material 12 may be silicon, germanium, etc.

An epitaxial layer 14A and 14B is on top of the fin 12. If epitaxial layer 14A is the source then epitaxial layer 14B is the drain (or vice versa). The layers 14A and 14B generally may be referred to as layer 14. One skilled in the art understands how to form the source and drain in layer 14.

The HVt transistor device 40 and RVt transistor device 50 also include interlayer dielectric layer (ILD), sidewall spacers 18, high-k dielectric material 20, work function metal 22, metal 24, and capping layer 26. Although examples of a FinFET device may be discussed, embodiments with recessed high-k dielectric material 20 also apply to planar devices. Although not shown for the sake of clarity, the substrate 10 includes isolation oxide as understood by one skilled in the art.

FIGS. 2A through 2I illustrate cross-sectional views of a process flow for (simultaneously) building the HVt transistor device 40 and the RVt transistor device 50 in the multiple threshold voltage CMOS chip 60 according to an embodiment. Although FIGS. 2A through 2I illustrate fabrication of two transistor devices 40 and 50, FIGS. 2A through 2I are not meant to be limited to building two transistor devices. This process can (simultaneously) form numerous (10, 20, 30 . . . 50, 60 . . . 100, etc.) multiple threshold voltage transistor devices 40 and 50 in the multiple threshold voltage CMOS chip 60.

FIG. 2A shows the substrate 10 with the fin 12 deposited on the substrate 10. The sidewall spacers 18 are deposited on the fin 12 and patterned. The epitaxial layer 14 is deposited on the fin 12 and etched into the pattern. The interlayer dielectric (ILD) layer 16 is deposited and patterned.

The high-k dielectric layer 20 is deposited on the fin 12 and along the sidewall spacers 18. A work function metal layer 220 is deposited on the high-k dielectric layer 20 and along the walls of the high-k dielectric layer 20.

FIG. 2A shows that a narrow channel 205 (narrow trench) and a long channel 207 (wide trench) are formed. The narrow channel 205 may have a width w1 in the x-direction, and the long channel 207 may have a width w2 in the x-direction. The width W2 of the long channel 207 is greater than the width W1 of the narrow channel 205. In this example, the narrow channel 205 is to be the regular/low threshold voltage transistor device 50 and the long channel 207 is to be the high threshold voltage transistor device 40.

The sidewall spacers 18 may be an insulating material such as an oxide. The sidewall spacer 18 may include nitride. The fin material 12 may include silicon, germanium, etc. Similarly, the epitaxial layer 14 (14A and 14B) may be (epitaxially grown) silicon, germanium, etc. The work function metal layer 220 may be a sacrificial layer, and the sacrificial layer may include metal and/or dielectric materials. The work function metal layer 220 may include titanium nitride.

The interlayer dielectric (ILD) layer 16 may include dielectric materials such as oxides, nitrides, etc. Examples of the high-k dielectric material 20 may include hafnium oxide, aluminum oxide, and magnesium oxide.

Figure 2B:
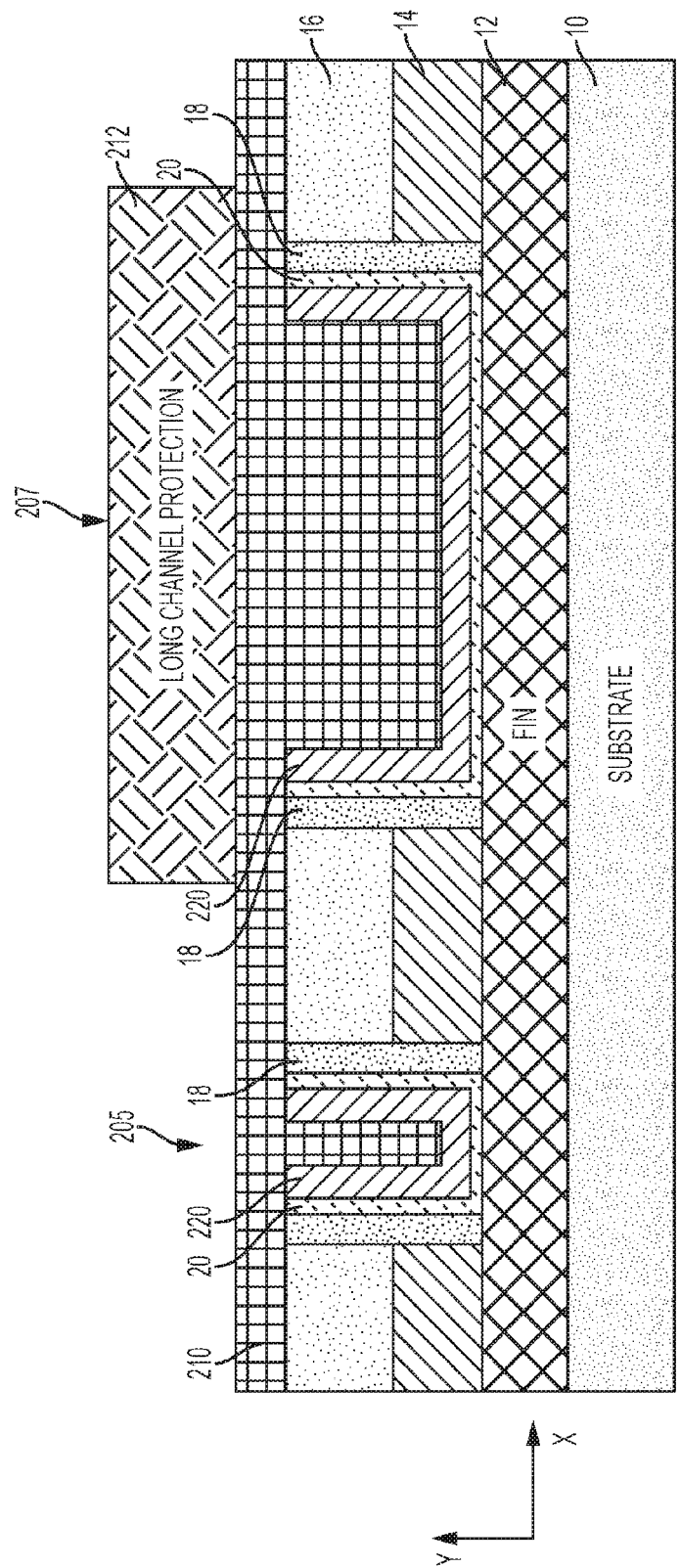

FIG. 2B shows a chamfer-protection (CP) material 210 deposited on the top surface, in the narrow channel 205, and in the long channel 207 for protecting the narrow trench 205 and the long trench 207. In one case, the narrow channel 205 may have a width W1<4 nanometers (nm), and the long channel 207 may have a width W2>50 nm. The chamfer-protection material 210 should have a good gap-fill capability for narrow channel 205 (gap<4 nm) with a trench depth 120 nm (in the y direction). This blanket CP material 210 can be spin-on, CVD deposition, or reflow. The CP material 210 may include organic (carbon) containing materials, such as spin-on optical projection lithography (OPL) material or spin on $SiO_2$.

An optical lithography mask 212 is deposited on the CP material 210 and etched with optical lithography patterning to protect the long channel (W2>50 nm). The optical lithography mask 212 may be a resist material.

Figure 2C:
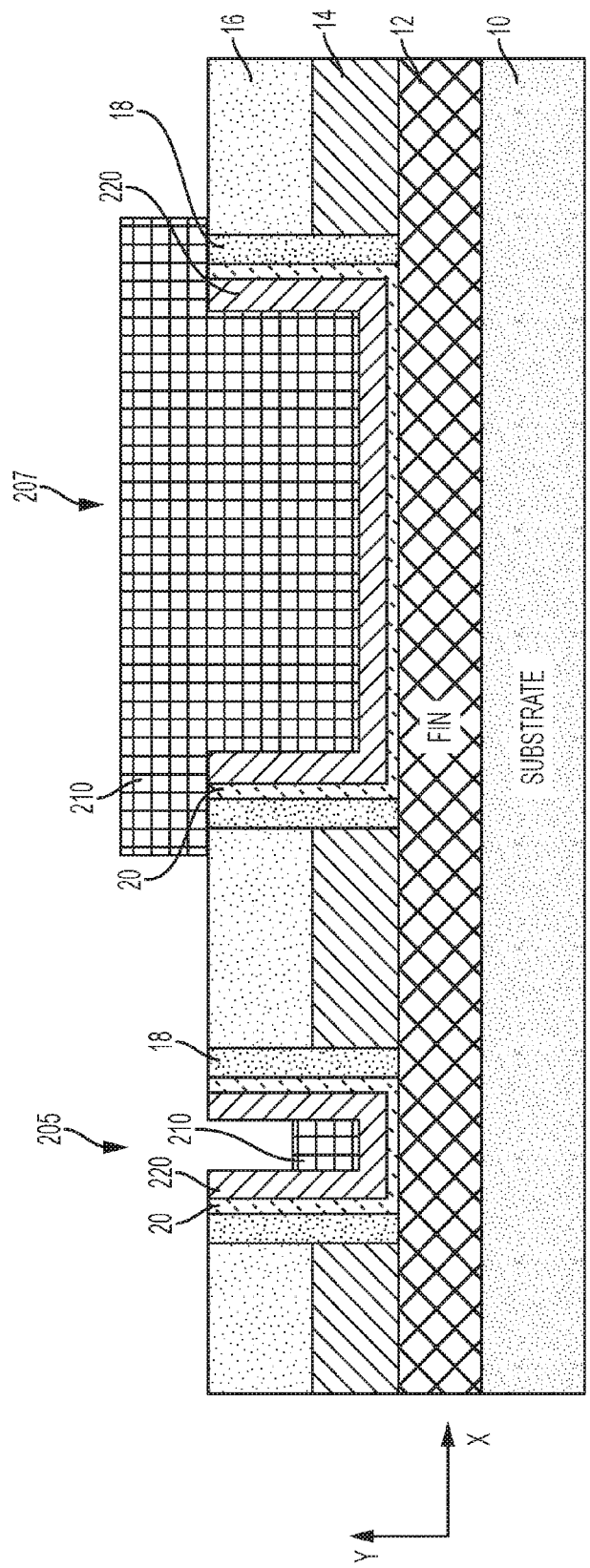

FIG. 2C shows that etching is performed to recess the chamfer-protection material 210 in the narrow gates (narrow channel 205) while the long gates (long channel 207) are protected by the optical lithography mask 212. After etching, the optical lithography mask 212 is removed. The thickness of the CP material 210 in the narrow channel 205 is now about half depth of the narrow channel 205. For example, when the narrow channel 205 has a trench depth 120 nm, the thickness/depth of the CP material 210 in the narrow channel 205 may be about 60 nm.

Figure 2D:
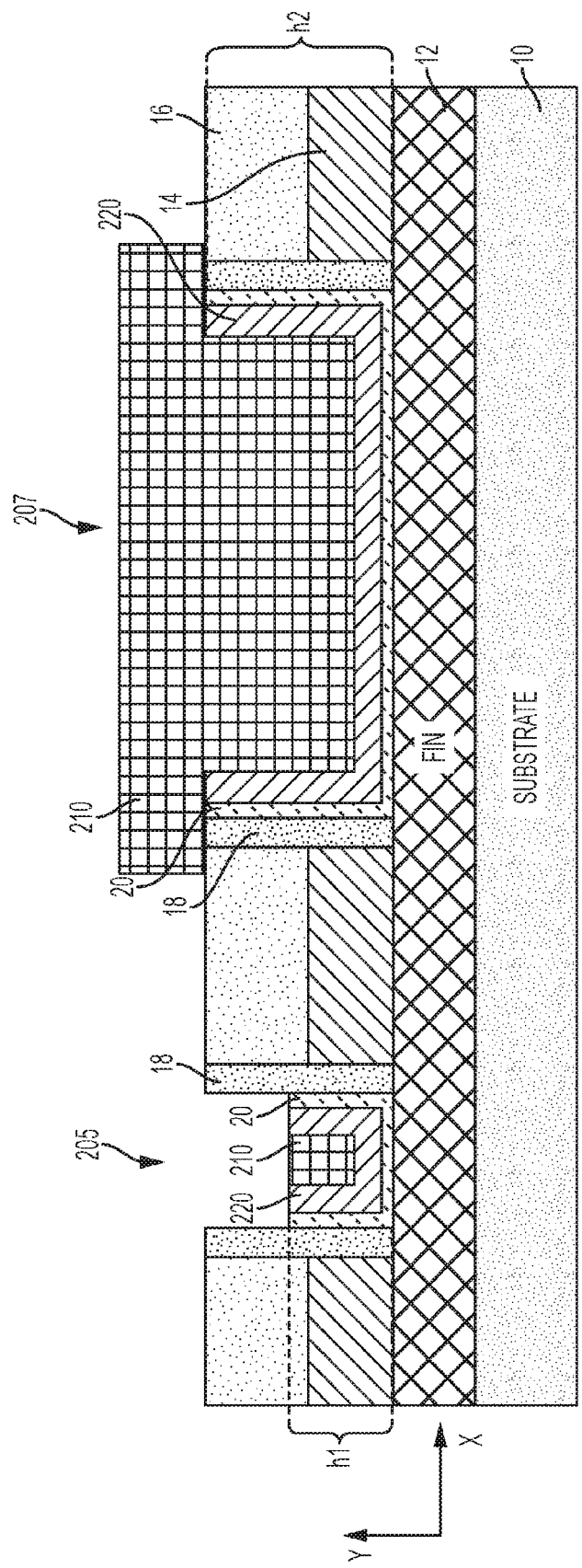

FIG. 2D shows that reactive ion etching (RIE) is performed to recess the high-k dielectric layer 20, the work function metal layer 220, and the CP material 210 in the narrow channel 205 (narrow gates), while the long channel 207 (wide gates) is protected. Oxygen in the recess RIE (plasma) process can further modulate the Vt in the narrow channel 205 (which is part in the RVt transistor device 50). That is, the threshold voltage Vt of the regular/low threshold voltage transistor device 50 is further reduced by the oxygen utilized in the RIE process to recess the high-k dielectric layer 20. The oxygen that ingresses into high-k dielectric modulates the voltage threshold (Vt) of the NFET.

As a result of the RIE process to recess the high-k dielectric layer 20, the high-k dielectric layer 20 has a height h1 in the narrow channel 205. However, the protected long channel 207 was not affected by the RIE processing, and the high-k dielectric layer 20 has a height h2. Accordingly, the height h1 is less than height h2 (i.e., h1<h2). In one case, the height h1 is about half the height h2. The height h1 may range from about 5-40 nm.

Additionally, the high-k dielectric layer 20 in the narrow channel 205 may be recessed (e.g., etched) by a predefined amount to remove part of the height of the high-k dielectric layer 20 in the narrow channel 205. In one case, the high-k dielectric layer 20 in the narrow channel 205 may be recessed (reduced) by about 20 nm (i.e., the height h1 is about 20 nm less than the height h1 in the long channel 207). In another case, the high-k dielectric layer 20 in the narrow channel 205 may be recessed (reduced) by about 40 nm (such that the height h1 is about 40 nm less than the height h1 in the long channel 207). In one case, the high-k dielectric layer 20 in the narrow channel 205 may be recessed (reduced) by about 60 nm (i.e., the height h1 is about 60 nm less than the height h1 in the long channel 207). The high-k dielectric layer 20 in the narrow channel 205 may be recessed (reduced) by about 20-60 nm. In particular, the high-k dielectric layer 20 in the narrow channel 205 may be recessed (reduced) by less than 40 nm to avoid potentially damaging the fin 12. In another case, the high-k dielectric layer 20 in the narrow channel 205 may be recessed (reduced) by no more than about 20 nm to avoid potentially damaging the fin 12.

Having the recessed (shorter) height h1 of the high-k dielectric layer 20 in the narrow channel 205 shorter as compared to the non-recessed (taller) height h2 of the high-k dielectric layer 20 in the long channel 207 causes the regular/low threshold voltage transistor device 50 to have a lower threshold voltage Vt than the high threshold voltage transistor device 40.

Figure 2E:
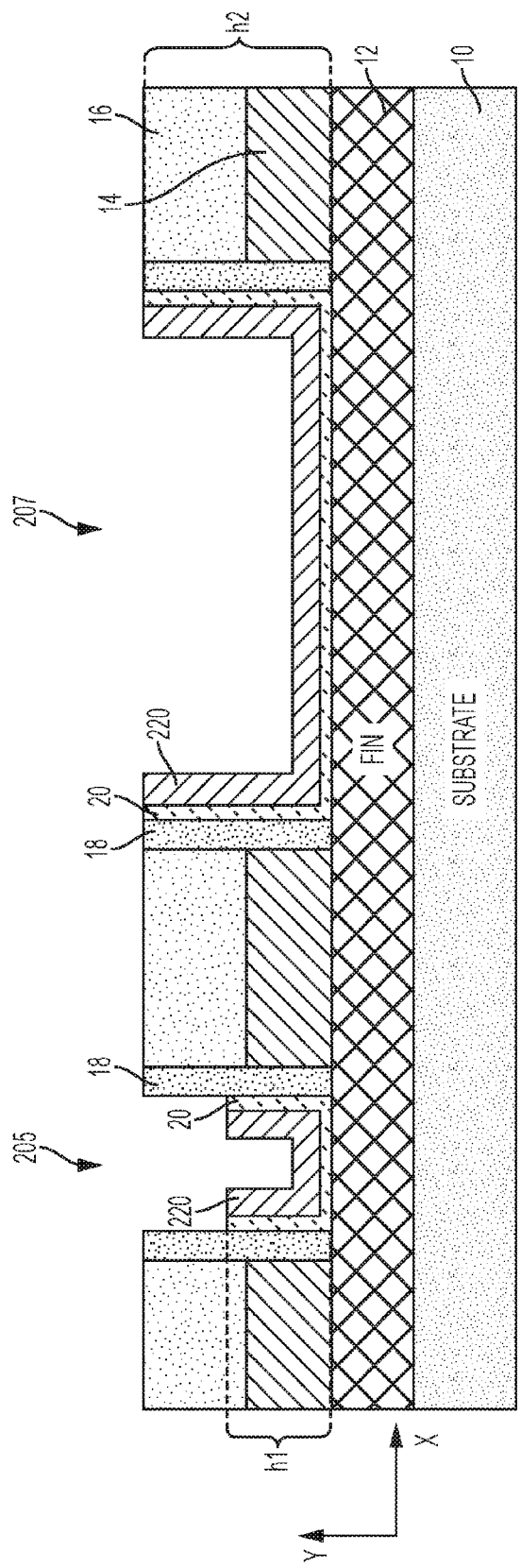

FIG. 2E shows that the chamfer-protection layer 210 in both the narrow channel 205 (narrow gate) and long channel 207 (wide gate) is stripped off by etching (e.g., ash off). After removing the chamfer-protection layer 210, rapid thermal annealing (RTA) is performed on the structure.

Figure 2F:
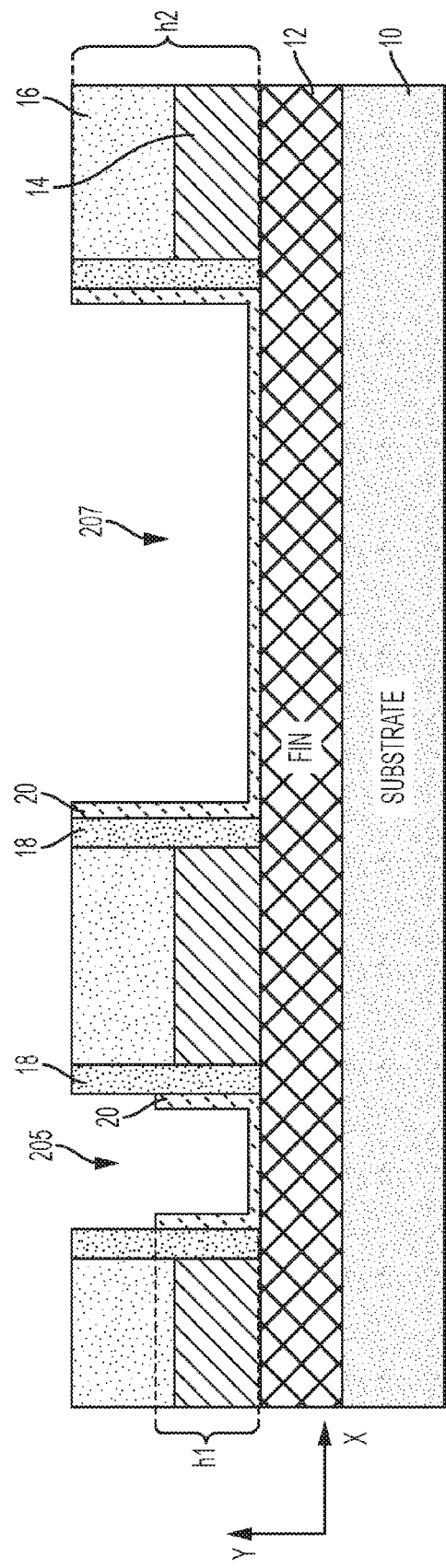
Figure 2G:
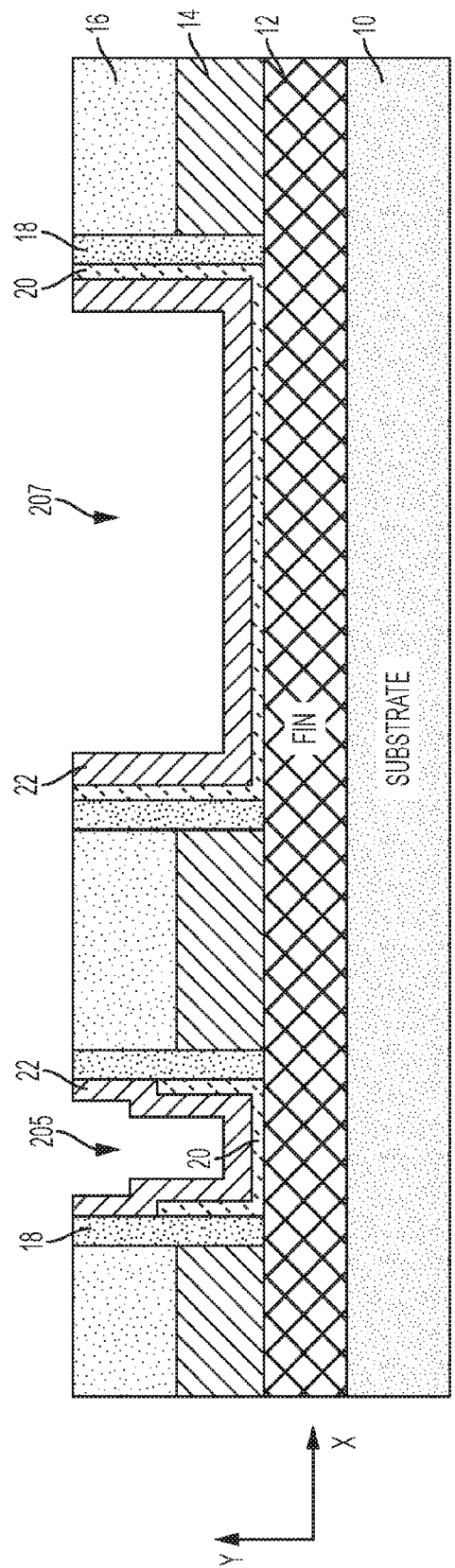

FIG. 2F illustrates optional processing of stripping off the work function metal layer 220. If the work function metal layer 220 layer is removed in FIG. 2F, FIG. 2G shows that work function metal (WFM) deposition is performed to deposit the work function metal 22, and the gate WFM patterning of the work function metal 22 is performed to define the n-type devices and/or p-type devices. The work function metal 22 may include Ti, TiAlN, TaC, TaCN, TaSiN, Mn, Zr, TiN, TaN, Ru, Mo, WN, or any suitable materials.

In another case, the work function metal layer 220 may not be stripped and allowed to remain. Not stripping the work function metal layer 220 causes different degree of Vt modulation in the NFET.

Figure 2H:
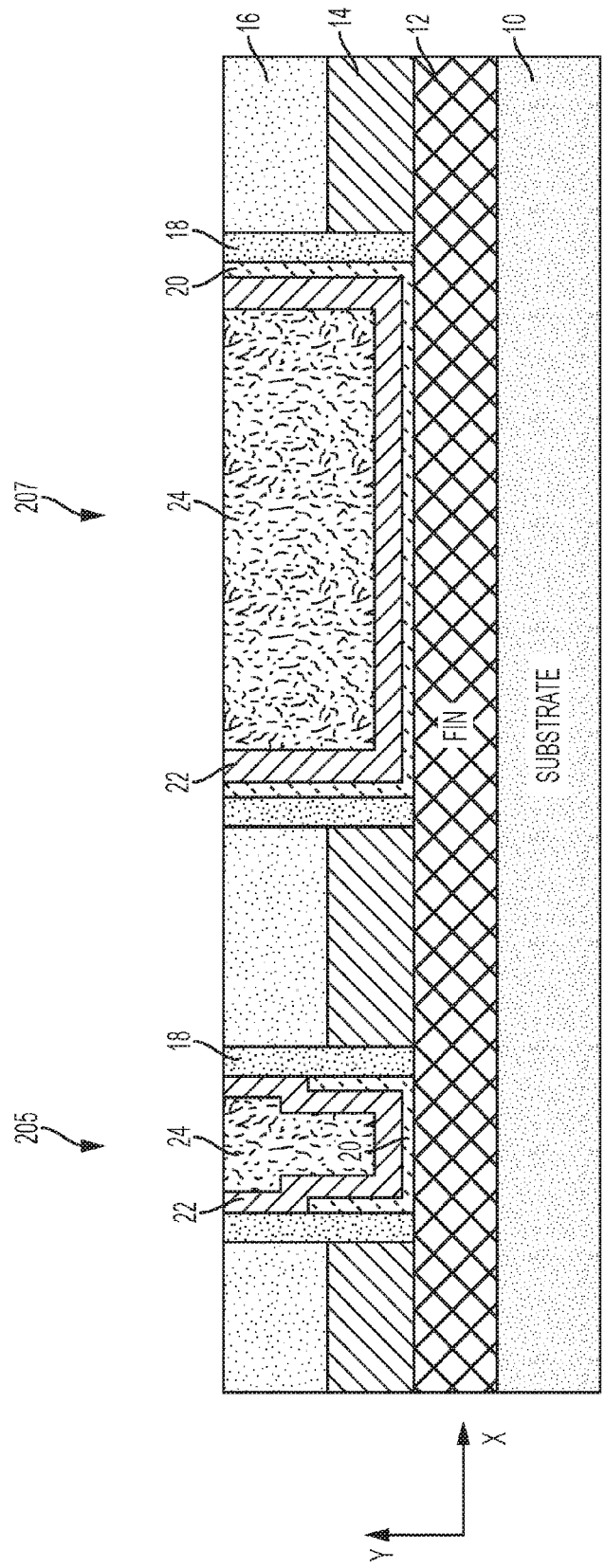

FIG. 2H shows that the gate conduction metal 24 is deposited on the work function metal layer 220 to fill the narrow trench 205 and the long trench 207. Chemical mechanical polishing/planarization (CMP) is performed to smooth off the excess gate conduction metal 24. The gate conduction metal 24 may be W, Al, and/or Co.

FIG. 2I illustrates gate cap dielectric deposition of the gate capping layer 26. The gate capping layer 24 may be a dielectric such as SiN, $SiO_2$, etc. FIG. 2I illustrates the formation of high threshold voltage transistor devices 40 and regular/low threshold voltage transistor devices 50 in the multiple threshold voltage CMOS chip 60. It is noted that this voltage threshold (Vt) modulation is effective at a gate width in the range of approximately 10-60 nm wide.

Figure 2:
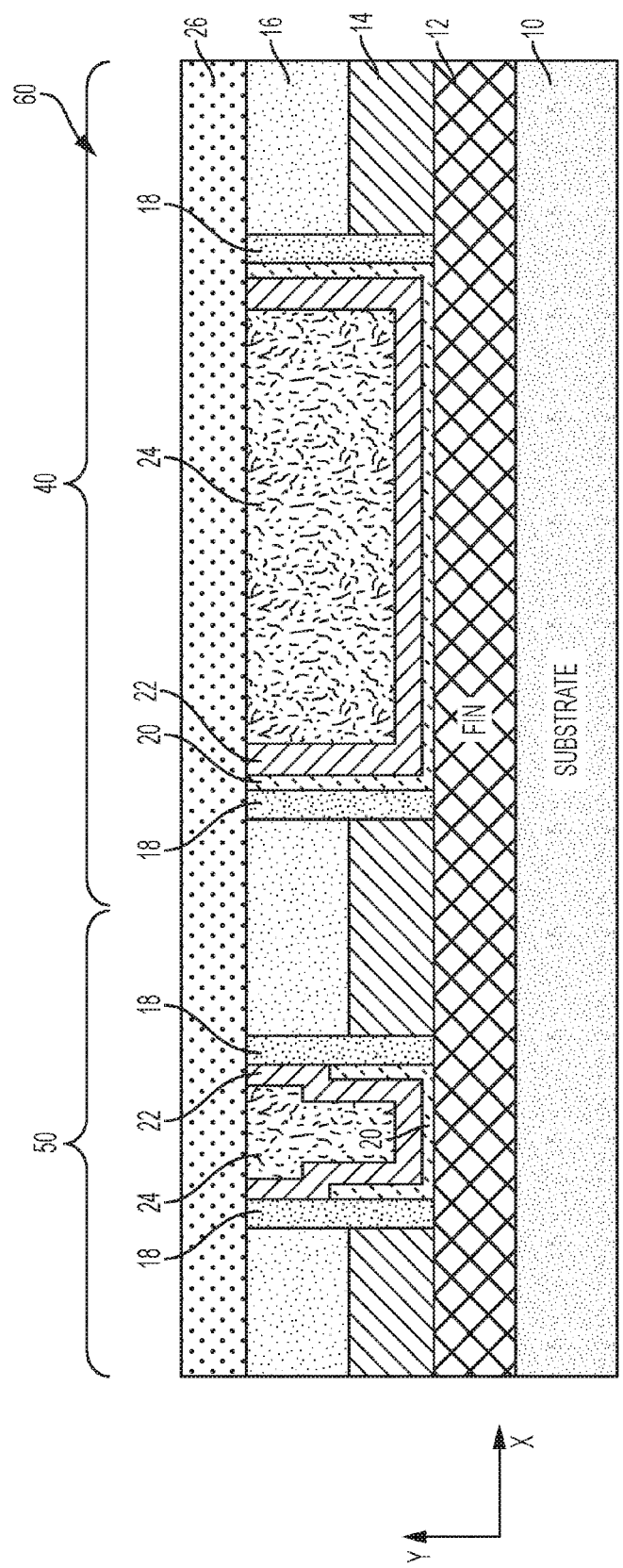
Figure 3A:
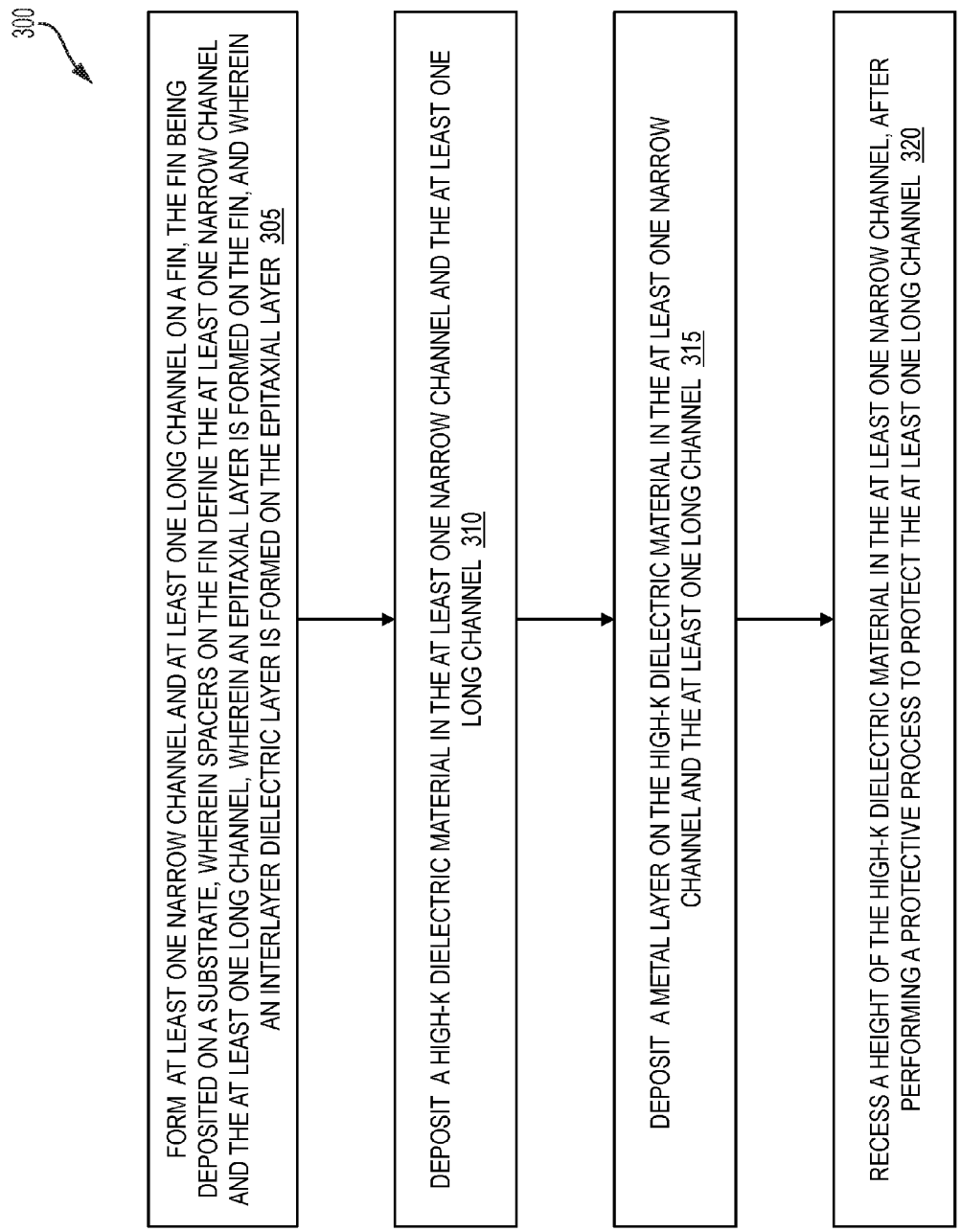
FIGS. 3A and 3B together illustrate a method of forming a multiple threshold voltage transistor structure according to an embodiment.
Figure 3B:
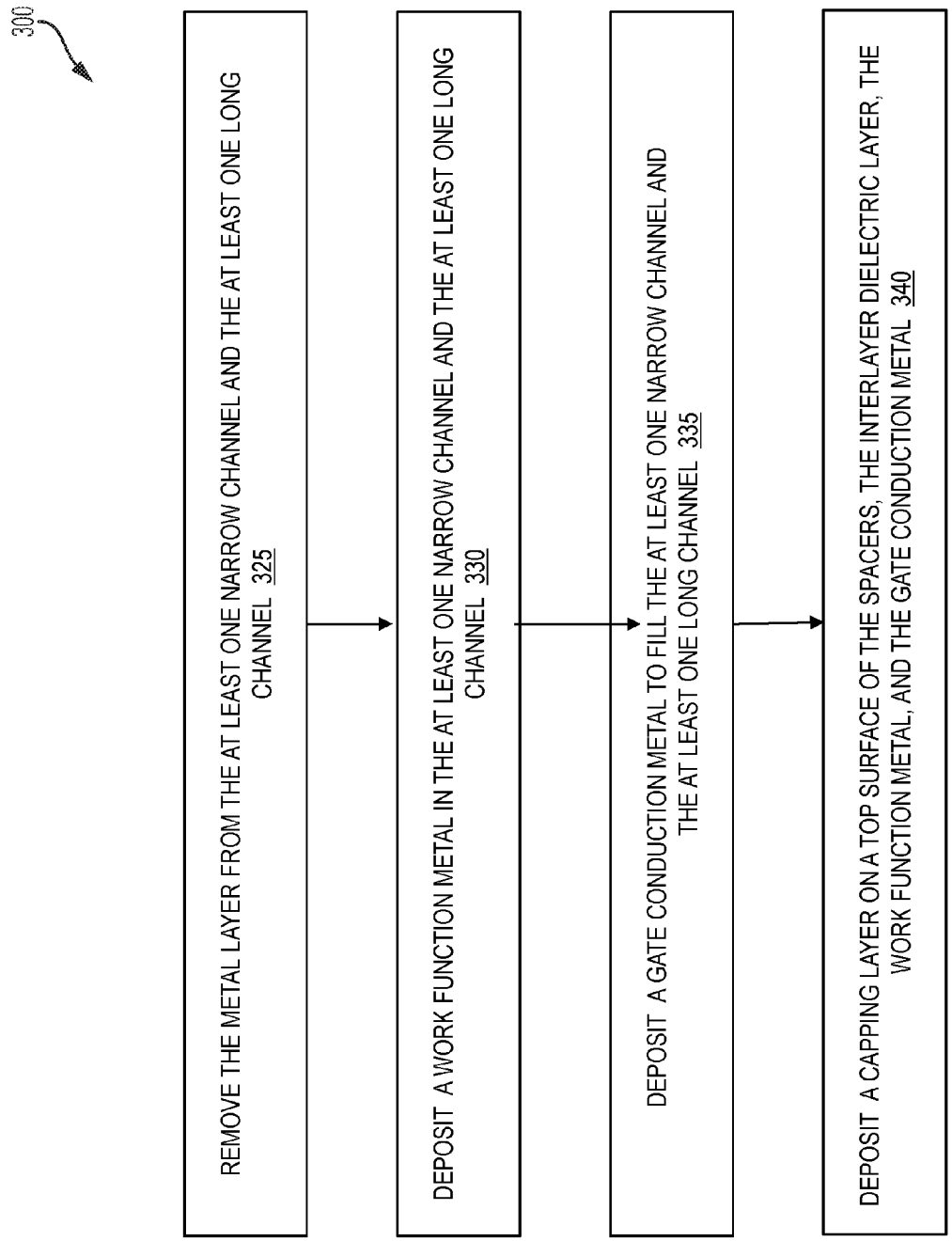

FIGS. 3A and 3B illustrate a method 300 of forming a multiple threshold voltage transistor structure (such as the multiple threshold voltage CMOS chip 60) according to an embodiment. Reference can be made to FIGS. 1 and 2.

At block 305, at least one narrow channel and at least one long channel are formed on the fin 12, and the fin 12 is deposited on a substrate as shown in FIG. 2A. The sidewall spacers 18 on the fin 12 define the at least one narrow channel 205 and the at least one long channel 207, where the epitaxial layer 14 is formed on the fin 12, and the interlayer dielectric layer (ILD) 16 is formed on the epitaxial layer 14.

At block 310, the high-k dielectric material 20 is deposited in the at least one narrow channel 205 and the at least one long channel 207 as shown in FIG. 2A.

At block 315, the metal layer 220 is deposited on the high-k dielectric material 20 in the at least one narrow channel 205 and the at least one long channel 207 as shown in FIG. 2A.

At block 320, a height of the high-k dielectric material in the at least one narrow channel 205 is recessed (to received height h1 as shown in FIG. 2C), after performing a protective process (shown in FIGS. 2B and 2C) to protect the at least one long channel 207.

At block 325, the metal layer 220 is removed from the at least one narrow channel 205 and the at least one long channel 207 as shown in FIG. 2F.

At block 330, the work function metal 22 is deposited in the at least one narrow channel 205 and the at least one long channel 207 as shown in FIG. 2G.

At block 335, the gate conduction metal 24 is deposited to fill the at least one narrow channel 205 and the at least one long channel 207 as shown in FIG. 2H.

At block 340, the capping layer 26 is deposited on the top surface of the sidewall spacers 18, the interlayer dielectric layer 16, the work function metal 22, and the gate conduction metal 24 as shown in FIG. 2I.

Recessing the height of the high-k dielectric material in the at least one narrow channel comprises removing a top portion of the high-k dielectric material in the at least one narrow channel 205 as shown in FIG. 2F. The top portion of the high-k dielectric material is along the sidewall spacers 18.

In one case, recessing the height of the high-k dielectric material in the at least one narrow channel comprises removing less than 20 nanometers from the height of the high-k dielectric material in the at least one narrow channel. In another case, recessing the height of the high-k dielectric material in the at least one narrow channel comprises removing about 20 nanometers from the height of the high-k dielectric material in the at least one narrow channel.

In one case, recessing the height of the high-k dielectric material in the at least one narrow channel comprises removing about 30 nanometers from the height of the high-k dielectric material in the at least one narrow channel. In another case, recessing the height of the high-k dielectric material in the at least one narrow channel comprises removing about 20-40 nanometers from the height of the high-k dielectric material in the at least one narrow channel.

The recessed height h1 of the high-k dielectric material in the at least one narrow channel is about half the other height h2 of the high-k dielectric material in the at least one long channel.

Performing the protective process (in FIGS. 2B and 2C) to protect the at least one long channel includes: depositing a first protective material in the at least one narrow channel and the at least one long channel, forming a second protective material over the first protective material above the at least one long channel, removing a portion of the first protective material in the at least one narrow channel (while the second protective material protects the at least one long channel), and after removing the second protective material is removed and after recessing the height of the high-k dielectric material in the at least one narrow channel, removing the first protective material.

The recessed height h1 of the high-k dielectric material in the at least one narrow channel forms at least one low threshold voltage transistor 50, and the regular height h2 of the high-k dielectric material in the at least one long channel forms at least one high threshold voltage transistor 40. The high-k dielectric material includes hafnium oxide.

FIG. 4 illustrates a method 400 of configuring a multiple threshold voltage transistor structure (e.g., CMOS chip 60) according to an embodiment.

At bock 405, at least one first transistor 50 having a high-k dielectric material with a first height h1 is provided, where the substrate 10 support the first transistor 50.

At block 410, at least one second transistor 40 having the high-k dielectric material with a second height h2, where the substrate 10 supports the second transistor 40.

At block 415, the first height h1 of the high-k dielectric material in the at least one first transistor 50 is less than the second height h2 of the high-k dielectric material in the at least one second transistor 40.

Figure 5:
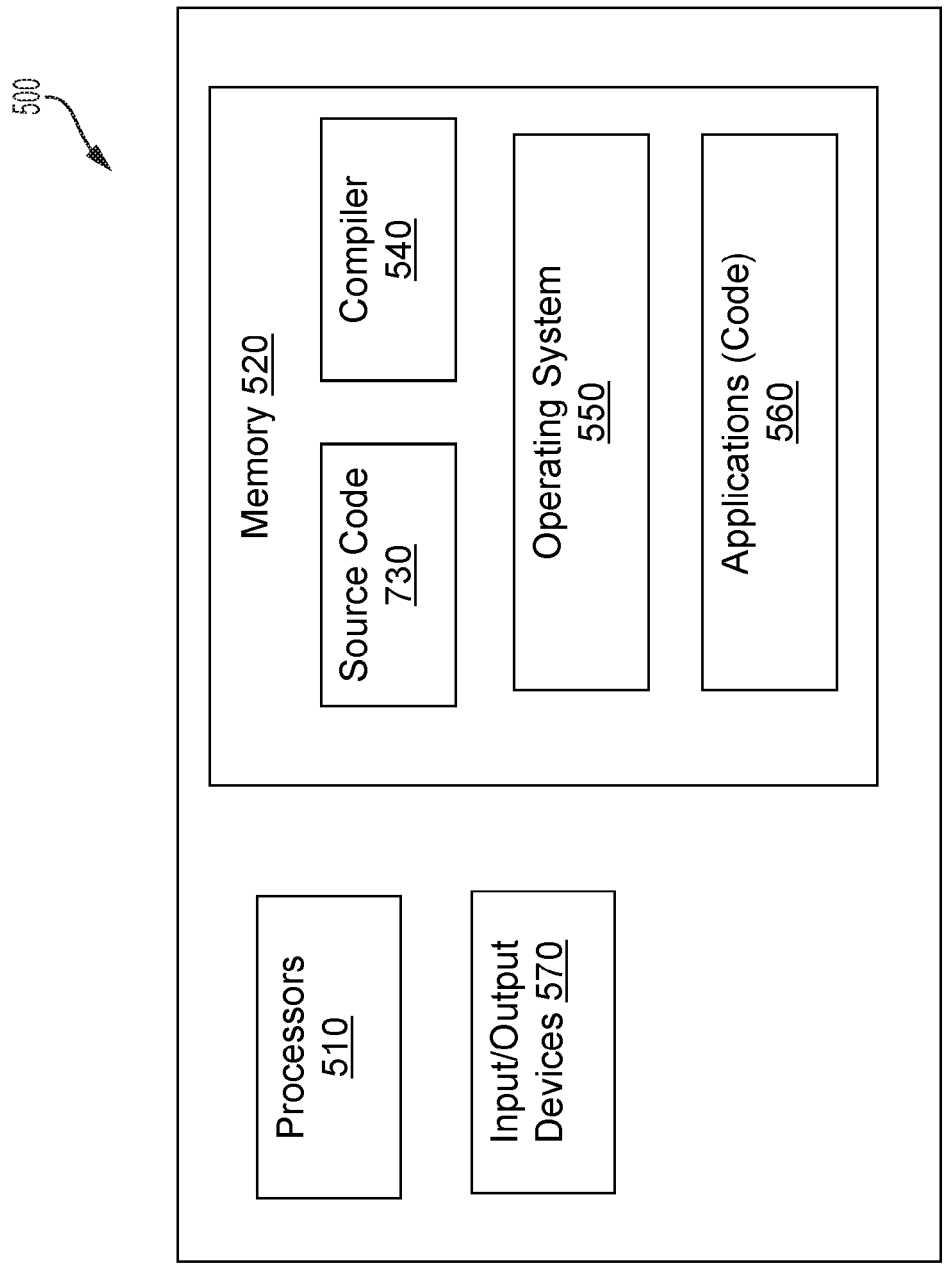
FIG. 5 illustrates an example of a computer having one or more transistors included and utilized in embodiments.

FIG. 5 illustrates an example of a computer 500 having capabilities, which may be included in exemplary embodiments. Various methods, procedures, modules, flow diagrams, tools, applications, circuits, elements, and techniques discussed herein may also incorporate and/or utilize the capabilities of the computer 500. Moreover, capabilities of the computer 500 may be utilized to implement features of exemplary embodiments discussed herein. One or more of the capabilities of the computer 500 may be utilized to implement, incorporate, to connect to, and/or to support any element discussed herein (as understood by one skilled in the art) in FIGS. 1-4. The transistors 40, 50 and/or chip 60 may be utilized in processors, memory, etc., in the computer 500.

Generally, in terms of hardware architecture, the computer 500 may include one or more processors 510, computer readable storage memory 520, and one or more input and/or output (I/O) devices 570 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 510 is a hardware device for executing software that can be stored in the memory 520. The processor 510 can be virtually any custom made or commercially available processor, a central processing unit (CPU), a data signal processor (DSP), or an auxiliary processor among several processors associated with the computer 500, and the processor 510 may be a semiconductor based microprocessor (in the form of a microchip) or a microprocessor. Note that the memory 520 can have a distributed architecture, where various components are situated remote from one another, but can be accessed by the processor 510.

The software in the computer readable memory 520 may include one or more separate programs, each of which comprises an ordered listing of executable instructions for implementing logical functions. The software in the memory 520 includes a suitable operating system (O/S) 550 and one or more applications 560 of the exemplary embodiments. As illustrated, the application 560 comprises numerous functional components for implementing the features, processes, methods, functions, and operations of the exemplary embodiments. The application 560 of the computer 500 may represent numerous applications, agents, software components, modules, interfaces, controllers, etc., as discussed herein but the application 560 is not meant to be a limitation.

The operating system 550 may control the execution of other computer programs, and provides scheduling, input-output control, file and data management, memory management, and communication control and related services.

The application 560 may be a source program, executable program (object code), script, or any other entity comprising a set of instructions to be performed. When a source program, then the program is usually translated via a compiler, assembler, interpreter, or the like, which may or may not be included within the memory 520, so as to operate properly in connection with the O/S 550. Furthermore, the application 560 can be written as (a) an object oriented programming language, which has classes of data and methods, or (b) a procedure programming language, which has routines, subroutines, and/or functions.

The I/O devices 570 may include input devices (or peripherals) such as, for example but not limited to, a mouse, keyboard, scanner, microphone, camera, etc. Furthermore, the I/O devices 570 may also include output devices (or peripherals), for example but not limited to, a printer, display, etc. Finally, the I/O devices 570 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 570 also include components for communicating over various networks, such as the Internet or an intranet. The I/O devices 570 may be connected to and/or communicate with the processor 510 utilizing Bluetooth connections and cables (via, e.g., Universal Serial Bus (USB) ports, serial ports, parallel ports, FireWire, HDMI (High-Definition Multimedia Interface), PCIe, InfiniBand®, or proprietary interfaces, etc.).

When the computer 500 is in operation, the processor 510 is configured to execute software stored within the memory 520, to communicate data to and from the memory 520, and to generally control operations of the computer 500 pursuant to the software. The application 560 and the O/S 550 are read, in whole or in part, by the processor 510, perhaps buffered within the processor 510, and then executed.

When the application 560 is implemented in software it should be noted that the application 560 can be stored on virtually any computer readable storage medium for use by or in connection with any computer related system or method.

The application 560 can be embodied in any computer-readable medium for use by or in connection with an instruction execution system, apparatus, server, or device, such as a computer-based system, processor-containing system, or other system that can fetch the instructions from the instruction execution system, apparatus, or device and execute the instructions.

In exemplary embodiments, where the application 560 is implemented in hardware, the application 560 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the actions may be performed in a differing order or actions may be added, deleted or modified. Also, the term "coupled" describes having a signal path between two elements and does not imply a direct connection between the elements with no intervening elements/connections therebetween. All of these variations are considered a part of the disclosure.

It will be understood that those skilled in the art, both now and in the future, may make various improvements and enhancements which fall within the scope of the claims which follow.

What is claimed is:

1. A method of forming a multiple threshold voltage transistor structure, the method comprising:
   forming a first transistor having a high-k dielectric material with a first height; and
   forming a second transistor having the high-k dielectric material with a second height, the first height of the high-k dielectric material being different from the second height;
   wherein the first height and the second height are lengths of the high-k dielectric material extending up a sidewall trench starting at a fin underneath.

2. The method of claim 1, wherein the first transistor has a first trench and the second transistor has a second trench.

3. The method of claim 2, wherein the high-k dielectric material of the first transistor is in the first trench; and wherein the high-k dielectric material of the second transistor is in the second trench.

4. The method of claim 3, wherein the first trench and the second trench are formed on the fin.

5. The method of claim 4, wherein spacers define the first trench and the second trench.

6. The method of claim 5, wherein a work function metal is formed on the high-k dielectric material in the first trench and the second trench.

7. The method of claim 6, wherein a gate conduction metal is formed on the work function metal.

8. The method of claim 7, wherein the gate conduction metal fills the first trench and the second trench.

9. The method of claim 7, wherein an epitaxial layer is formed on the fin.

10. The method of claim 9, wherein an interlayer dielectric layer is formed on the epitaxial layer.

11. The method of claim 10, wherein a capping layer is on a top surface of the spacers, the interlayer dielectric layer, the work function metal, and the gate conduction metal.

12. The method of claim 2, wherein the first trench and the second trench have a different width.

13. The method of claim 2, wherein the first trench is narrow compared to the second trench.

14. The method of claim 1, wherein the first height of the high-k dielectric material is less than the second height.

15. The method of claim 1, wherein the first height of the high-k dielectric material is about half the second height.

16. The method of claim 1, wherein the first height ranges from about 5-40 nanometers.

17. The method of claim 1, wherein the first height is about 40 nanometers less than the second height.

18. The method of claim 1, wherein the first height is about 60 nm less than the second height.

19. The method of claim 1, wherein the first height of the high-k dielectric material in the first transistor forms a low threshold voltage transistor; and wherein the second height of the high-k dielectric material in the second transistor forms a high threshold voltage transistor.

20. The method of claim 1, wherein the first height is about 20 nanometers or less shorter than the second height.

* * * * *